United States Patent
Li et al.

(10) Patent No.: US 12,315,751 B2
(45) Date of Patent: May 27, 2025

(54) SYSTEM FOR A SEMICONDUCTOR FABRICATION FACILITY AND METHOD FOR OPERATING THE SAME

(71) Applicant: TAIWAN SEMICONDUCTOR MANUFACTURING COMPANY LTD., Hsinchu (TW)

(72) Inventors: Fu-Hsien Li, Taichung (TW); Chi-Feng Tung, Miaoli County (TW); Hsiang Yin Shen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 646 days.

(21) Appl. No.: 17/530,927

(22) Filed: Nov. 19, 2021

(65) Prior Publication Data

US 2022/0076975 A1 Mar. 10, 2022

Related U.S. Application Data

(62) Division of application No. 16/114,953, filed on Aug. 28, 2018, now Pat. No. 11,183,409.

(51) Int. Cl.
*H01L 21/677* (2006.01)
*A47L 7/00* (2006.01)
*A47L 9/28* (2006.01)

(52) U.S. Cl.
CPC ........ *H01L 21/67733* (2013.01); *A47L 7/009* (2013.01); *A47L 9/2805* (2013.01); *A47L 9/2836* (2013.01); *H01L 21/67724* (2013.01); *H01L 21/67727* (2013.01)

(58) Field of Classification Search
CPC ......... H01L 21/67733; H01L 21/67724; H01L 21/67727; H01L 21/67028; H01L 21/67259; H01L 21/6776; H01L 21/67; H01L 21/67011; H01L 21/67276; H01L 21/67703; A47L 7/009; A47L 9/2805; A47L 9/2836
See application file for complete search history.

(56) References Cited

U.S. PATENT DOCUMENTS 9,257,317 B2 * 2/2016 Lee .................. H01L 21/67733
11,183,409 B2 * 11/2021 Li ..................... H01L 21/67259

* cited by examiner

*Primary Examiner* — David Redding
(74) *Attorney, Agent, or Firm* — WPAT LAW; Anthony King

(57) ABSTRACT

An automatic cleaning unit for AMHS includes a plurality of sensors disposed on OHT rails. The sensors are configured to define a cleaning zone and to detect a location of an OHT vehicle. The automatic cleaning unit further includes a vacuum generator and a top cleaning part installed over the OHT rails in the cleaning zone. The top cleaning part is coupled to the vacuum generator. The vacuum generator is turned on to perform a vacuum cleaning operation when the sensors detect the OHT vehicle entering the cleaning zone.

20 Claims, 7 Drawing Sheets

SYSTEM FOR A SEMICONDUCTOR FABRICATION FACILITY AND METHOD FOR OPERATING THE SAME

PRIORITY CLAIM AND CROSS-REFERENCE

This patent is a divisional application of U.S. patent application Ser. No. 16/114,953 filed on Aug. 28, 2018, entitled of "SYSTEM FOR A SEMICONDUCTOR FABRICATION FACILITY AND METHOD FOR OPERATING THE SAME", which application is hereby incorporated herein by reference.

BACKGROUND

Automated Material Handling Systems (AMHS) have been widely used in semiconductor fabrication facilities ("FABS") to automatically handle and transport groups or lots of wafers between various processing machines ("tools") used in chip manufacturing. A typical FAB may include one or more floors having a plurality of process bays including processing tools and wafer staging equipment, which are interconnected by the AMHS.

Each bay may include a wafer stocker, which includes multiple bins for temporarily holding and staging a plurality of wafer carriers during the fabrication process. The wafer carriers may include standard mechanical interface (SMIF) pods which may bold a plurality of 200 mm (8 inch) wafers, or front opening unified pods (FOUPs) which may hold larger 300 mm (12 inch) wafers. Stockers generally include a single mast robotic lift or crane having a weight bearing capacity sufficient for lifting, inserting, and retrieving single wafer carriers one at a time from the bins. The stocker holds multiple SMIF pods or FOUPs in preparation for transporting a SMIF or FOUP to the loadport of a processing tool.

A semiconductor FAB may include numerous types of automated and manual vehicles for moving and transporting wafer carriers throughout the FAB during the manufacturing process. These may include, for example, automatic guided vehicles (AGVs), personal guided vehicles (PGVs), rail guided vehicles (RGVs), overhead shuttles (OHSs), and overhead hoist transports (OHTs). An OHT system automatically moves OHT "vehicles" that carry and transport wafer carriers, such as SMIF pods or FOUPs holding multiple wafers, from a processing or work tool or a stocker to the loadport of another tool or other apparatus in the FAB. The OHT system may be used to transport vehicles within each bay (intra-bay) or between bays (inter-bay). The OHT system also moves empty vehicles (i.e., vehicles without a wafer carrier) to the tool loadport or other apparatus for receiving and removing empty or full SMIF pods or FOUPs that may contain wafers for further transport and/or processing in other tools.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
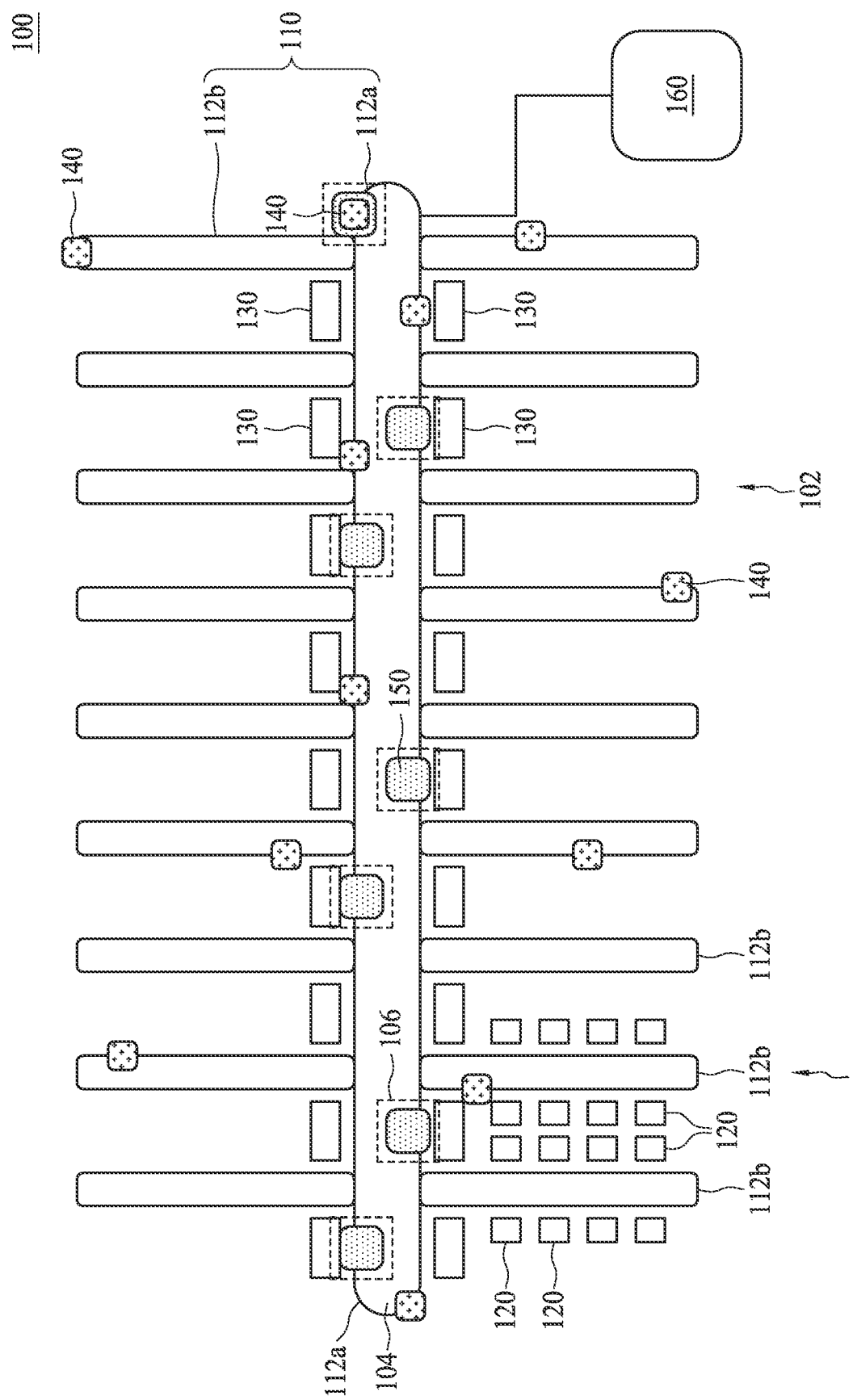
FIG. 1 is a schematic layout diagram of a system for the semiconductor fabrication facility, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of brevity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, terms such as "first," "second" and "third" describe various elements, components, regions, layers and/or sections, but these elements, components, regions, layers and/or sections should not be limited by these terms. These terms may be used only to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Handling and transport of 300 mm wafers in correspondingly larger and heavier FOUPS creates efficiency challenges for the AMHS to maintain expedient wafer flow between processing tools in the semiconductor FAB. In some embodiments, more than 8000 overhead hoist transport (OHT) vehicles are used. It is found that OHT vehicles have a tendency to generate particles or debris due to friction between wheels/rollers and the OHT rail. Such particles may fall down and potentially contaminate work tools and equipment that are delicate precision instruments and have expensive high-precision electronic components, which demand an absolutely clean environment in the facility during the conducting of manufacturing, processing and assembling procedures. In some embodiments, the particles caused by the movement of the OHT vehicle over an extended period of time may not be readily visible or noticeable upon falling from the overhead rail carrying the OHT, creating contaminated conditions in the facility. Such contamination is deleterious to the quality and integrity of the wafer being manufactured and threatens the functioning of work tools and equipment being employed beneath the OHT rail or the OHT vehicles.

In some embodiments, the OHT vehicles are taken from the OHT rails, moved to an area for cleaning, and the particles are manually removed by a vacuum cleaner. After the OHT cleaning operation, the OHT vehicles are put back to the OHT rails. The manual cleaning is performed at specified and occasionally requested time intervals. Such manual OHT vehicle cleaning operations are time-consuming and sometimes unable to achieve a required level of OHT vehicle cleanliness. For example, cleaning one OHT vehicle can require one hour. This results in manufacturing downtime and impacting the profitability of the FAB. Furthermore, manual cleaning procedures require extreme care in cleaning the OHT vehicles under requisite standards of cleanliness.

The present disclosure therefore provides an automatic cleaning unit, a system including automatic cleaning units and a method for cleaning the OHT vehicles automatically. The automatic cleaning unit can be adapted to function on the OHT rails. In some embodiments, the automatic cleaning unit includes sensors to detect a location of the OHT vehicle and thus the automatic cleaning unit can be automatically turned on when the OHT vehicle is approaching or entering the automatic cleaning unit. A cleaning operation is then performed to remove particles from the OHT vehicles. Further, the automatic cleaning unit can also be automatically turned off when the cleaning operation is completed or after the OHT vehicle leaves the automatic cleaning unit. Further, the automatic cleaning unit includes vacuum cleaning equipment for removing particles from the OHT vehicle from three directions.

Figure 2:
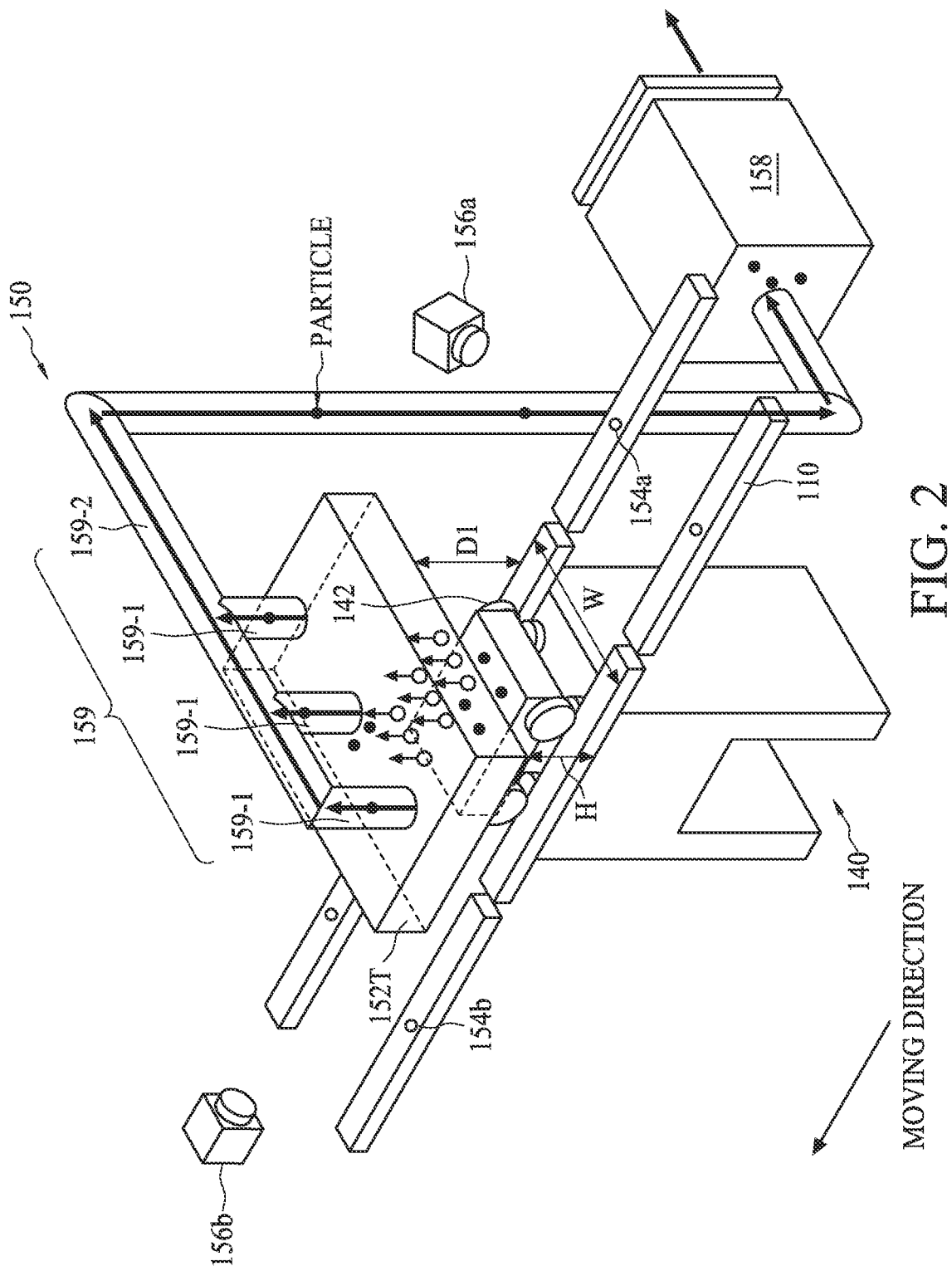
FIG. 2 is a schematic drawing of a portion of the system according to aspects of the present disclosure in one or more embodiments.
Figure 3:
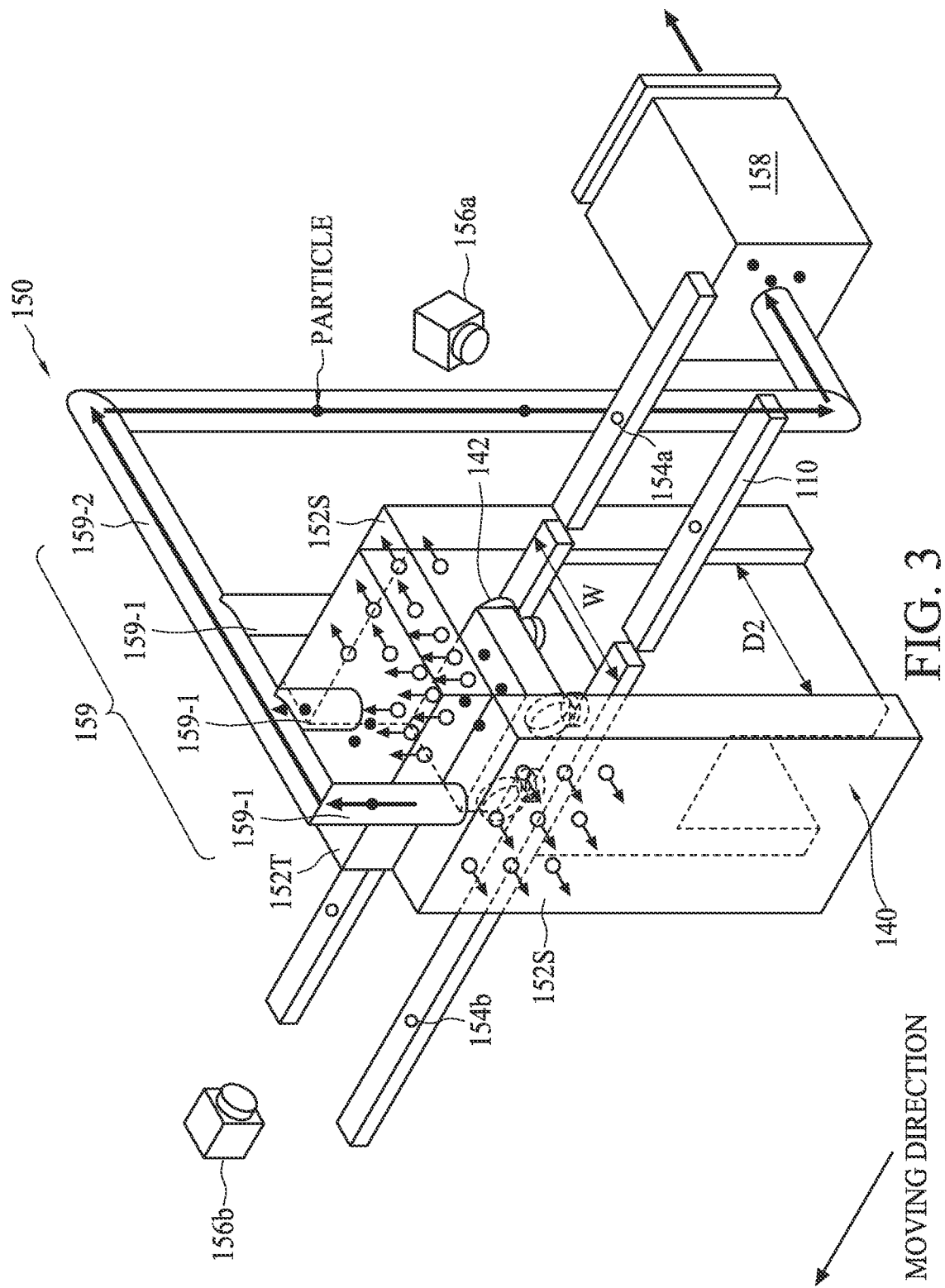
FIG. 3 is a schematic drawing of a portion of an automatic cleaning unit according to aspects of the present disclosure in one or more embodiments.

FIG. 1 is a schematic layout diagram of a system 100 for the semiconductor fabrication facility in accordance with some embodiments of the present disclosure, FIG. 2 is a schematic drawing of a portion of the system 100 in accordance with some embodiments of the present disclosure, and FIG. 3 is a schematic drawing of a portion of the system 100 in accordance with other embodiments of the present disclosure. The system 100 is provided in a clean room of a semiconductor factory or the like. In some embodiments, the system 100 can be provided in facility having one or more floors, but the disclosure is not limited thereto. Referring to FIG. 1, the system 100 includes a network of OHT rails 110, a plurality of wafer processing or metrology tools 120, a plurality of wafer stockers 130, a plurality of OHT vehicles 140, a plurality of sensors 154a and 154b (shown in FIGS. 2 and 3) on the OHT rails 110, and a plurality of automatic cleaning units 150.

Referring to FIG. 1, the system 100 is usually organized into a plurality of bays 102 each including several of the wafer processing or metrology tools 120. In some embodiments, each bay 102 may include several tools 120 for performing various semiconductor manufacturing, testing, or metrology steps. Thus, the network of OHT rails 110 can include two types of transport loops: the inter-bay loop 112a between the bays 102, and the intra-bay loop 112b between the processing tools 120 of a single bay 102. In some embodiments, it is also possible that these two types of transport loops can be merged into one monolithic system with appropriate control and transfer mechanisms. In some embodiments, the inter-bay loop 112a can be arranged over a central corridor or a central aisle 104, and the plurality of bays 102 (each including the several tools 120) are arranged on opposing lateral sides of the central aisle 104, as shown in FIG. 1, but the disclosure is not limited thereto. Thus, the intra-bay loops 112b are also arranged on the opposite lateral sides of the central aisle 104, as shown in FIG. 1. In some embodiments, the OHT rails 110 are monorails that are affixed to and suspended from the ceiling of the clean room.

Each bay 102 may include a wafer stocker 130, which includes multiple bins for temporarily holding and staging a plurality of wafer carriers during the fabrication process. The wafer carriers may include standard mechanical interface (SMIF) pods which may hold a plurality of 200 mm (8 inch) wafers, or front opening unified pods (FOUPs) which may hold larger 300 mm (12 inch) wafers. In some embodiments, the wafer stockers 130 include a single mast robotic lift or crane having a weight bearing capacity sufficient for lifting, inserting, and retrieving wafer carriers once at a time from the bins. The wafer stocker 130 holds multiple SMIF pods or FOUPs in preparation for transporting a SMIF or FOUP to the loadport of a processing tool.

Referring to FIGS. 1 to 3, the OHT vehicles 140 are movably mounted on the OHT rails 110 along a moving direction. Each of the OHT vehicles 140 is operable to transport the wafer carrier (not shown) through the system 100 for inter-bay or intra-bay movement. In some embodiments, each of the OHT vehicles 140 may be configured and structured to hold one wafer carrier at a given time and transport the wafer carrier in a generally horizontal direction from one direction to another within each bay 102 or between bays 102. As shown in FIGS. 2 and 3, each of the OHT vehicles 140 may include a wheeled trolley 142, which is configured to complement and cooperate with the OHT rails 110 for rolling movement along the OHT rails 110. In other words, the OHT vehicles 140 are suspended from the OHT rails 110 through the wheeled trolley 142. In some embodiments, the wheeled trolley 142 may include a height H and a width W. It should be understood that embodiments in which the OHT rails 110 mate with the wheeled trolley 142 are not limited to any particular configuration so long as the OHT vehicles 140 are appropriately supported from the OHT rails 110 for rolling motion.

Referring to FIGS. 1 and 2, in some embodiments, the plurality of first sensors 154*a* and 154*b* are disposed on the OHT rails 110 to detect locations of the OHT vehicles 140. In some embodiments, the first sensors 154*a* and 154*b* can include a laser sensor, a limit switch, a touch sensor, an ultrasonic sensor, a camera or any suitable mechanically actuated device, but the disclosure is not limited thereto. More importantly, the first sensors 154*a* and 154*b* are used to define a plurality of cleaning zones 106, and the automatic cleaning units 150 are installed in the cleaning zones 106, respectively. In some embodiments, the cleaning zone 106 can be greater than the automatic cleaning unit 150, as shown in FIG. 1, but the disclosure is not limited thereto. Still referring to FIG. 1, the automatic cleaning units 150 are separated from each other by a distance, and the distance between two automatic cleaning units 150 is between approximately 500 m and approximately 3000 m, but the disclosure is not limited thereto. In some embodiments, the distances between the automatic cleaning units 150 are identical. In other embodiments, the distances between the automatic cleaning units 150 vary. In some embodiments, the first sensors 154*a* and 154*b* can include different functions, which will be described below. In some embodiments, the automatic cleaning units 150 of the system 100 can further include a plurality of second sensors 156*a* and 156*b* over the OHT rails 110. In some embodiments, the second sensors 156*a* and 156*b* are disposed proximate to the cleaning zone 106, as shown in FIGS. 2 and 3. The second sensors 156*a* and 156*b* can include a camera, but the disclosure is not limited thereto. In some embodiments, the second sensors 156*a* and 156*b* can include different functions, which will be described below. In some embodiments, the system 100 further includes a controller 160 (as shown in FIG. 1) in communication with the sensors 154*a* and 154*b* and the cleaning units 150 and controlling operations of the system 100, as will be described hereinafter.

Referring to FIG. 2, in some embodiments, each of the automatic cleaning units 150 includes the plurality of first sensors 154*a* and 154*b*, a vacuum generator 158, a piping system 159 and a top cleaning part 152T. In some embodiments, the first sensors 154*a* and 154*b* can include a laser sensor, a limit switch, a touch sensor, an ultrasonic sensor, a camera or any suitable mechanically actuated device, but the disclosure is not limited thereto. The first sensors 154*a* and 154*b* are configured to detect a location of the OHT vehicle 140. The top cleaning part 152T is installed over the OHT rails 110 in the cleaning zone 106. Further, the top cleaning part 152T of the automatic cleaning unit 150 is spaced apart from the OHT rails 110 by a distance D1. In some embodiments, the distance D1 between the top cleaning part 152T and the OHT rail 110 is greater than the height H of the wheeled trolley 142 of the OHT vehicle 140 such that the OHT vehicle 140 is allowed to pass through along a moving direction as shown in FIG. 2. Further, a size of the top cleaning part 152T is substantially greater than that of the wheeled trolley 142 of the OHT vehicle 140. In some embodiments, the top cleaning part 152T is connected to the vacuum generator 158 by the piping system 159. In some embodiments, ratio of an amount of the vacuum generators 158 and an amount of the automatic cleaning units 150 is 1:1, but the disclosure is not limited thereto. In some embodiments, each automatic cleaning unit 150 may include a vacuum generator 158. In some embodiments, two or more cleaning units may share one vacuum generator 158. In some embodiments, a high efficiency particulate air (HEPA) filter can be adopted in the vacuum generator 158 for preventing pollution to the environment, but the disclosure is not limited thereto. In some embodiments, the vacuum generator 158 can include a pump, an ejector, etc. adapted to create the vacuum. In some embodiments, the piping system 159 includes a plurality of branch pipes 159-1 and a main pipe 159-2. As shown in FIG. 2, the plurality of branch pipes 159-1 are connected to the top cleaning part 152T, and the main pipe 159-2 connects the plurality of branch pipes 159-1 to the vacuum generator 158.

Referring to FIG. 3, in some embodiments, each of the automatic cleaning units 150 includes the plurality of first sensors 154*a* and 154*b*, the vacuum generator 158, the piping system 159, the top cleaning part 152T and a pair of side cleaning parts 152S. The pair of side cleaning parts 152S are coupled to the top cleaning part 152T. As shown in FIG. 3, the top cleaning part 152T is installed over the OHT rails 110 in the cleaning zone 106, while the pair of side cleaning parts 152S are installed at two sides of the OHT rails 110 in the cleaning zone 106. The automatic cleaning unit 150 is installed over the OHT rails 110. As mentioned above, the top cleaning part 152T of the automatic cleaning unit 150 is spaced apart from the OHT rails 110 by the distance D1 (shown in FIG. 2). Each of the pair of side cleaning parts 152S is spaced apart from OHT rails 110. Further, each of the pair of side cleaning parts 152S is separated from each other by a distance D2. In some embodiments, the distance D1 between the top cleaning part 152T and the OHT rail 110 is greater than the height H of the wheeled trolley 142 of the OHT vehicle 140 (shown in FIG. 2), and the distance D2 between each of the side cleaning parts 152S is greater than the width W of the OHT vehicle 140. Accordingly, the OHT vehicle 140 is allowed to pass through the automatic cleaning unit 150 along a moving direction as shown in FIG. 3. In some embodiments, the pair of side cleaning parts 152S are movable by a linear motion guide, an X-Y table or ball screws, so that the pair of side cleaning parts 152S are adjusted to be aligned with the wheeled trolley 142 of the OHT vehicle 140 when the OHT vehicle 140 stops in the cleaning zone 106. In some embodiments, ratio of an amount of the vacuum generators 158 and an amount of the automatic cleaning units 150 is 1:1, but the disclosure is not limited thereto. In some embodiments, each automatic cleaning unit 150 may include a vacuum generator 158. In some embodiments, two or more cleaning units may share one vacuum generator 158. In some embodiments, a high efficiency particulate air (HEPA) filter can be adopted in the vacuum generator 158 for preventing pollution to the environment, but the disclosure is not limited thereto. In some embodiments, the vacuum generator 158 can include a pump, an ejector, etc. adapted to create the vacuum. In some embodiments, the piping system 159 includes a plurality of branch pipes 159-1 and a main pipe 159-2. As shown in FIG. 3, the plurality of branch pipes 159-1 are connected to the top cleaning part 152T and the pair of side cleaning parts 152S, and the main pipe 159-2 connects the plurality of branch pipes 159-1 to the vacuum generator 158.

Figure 4A:
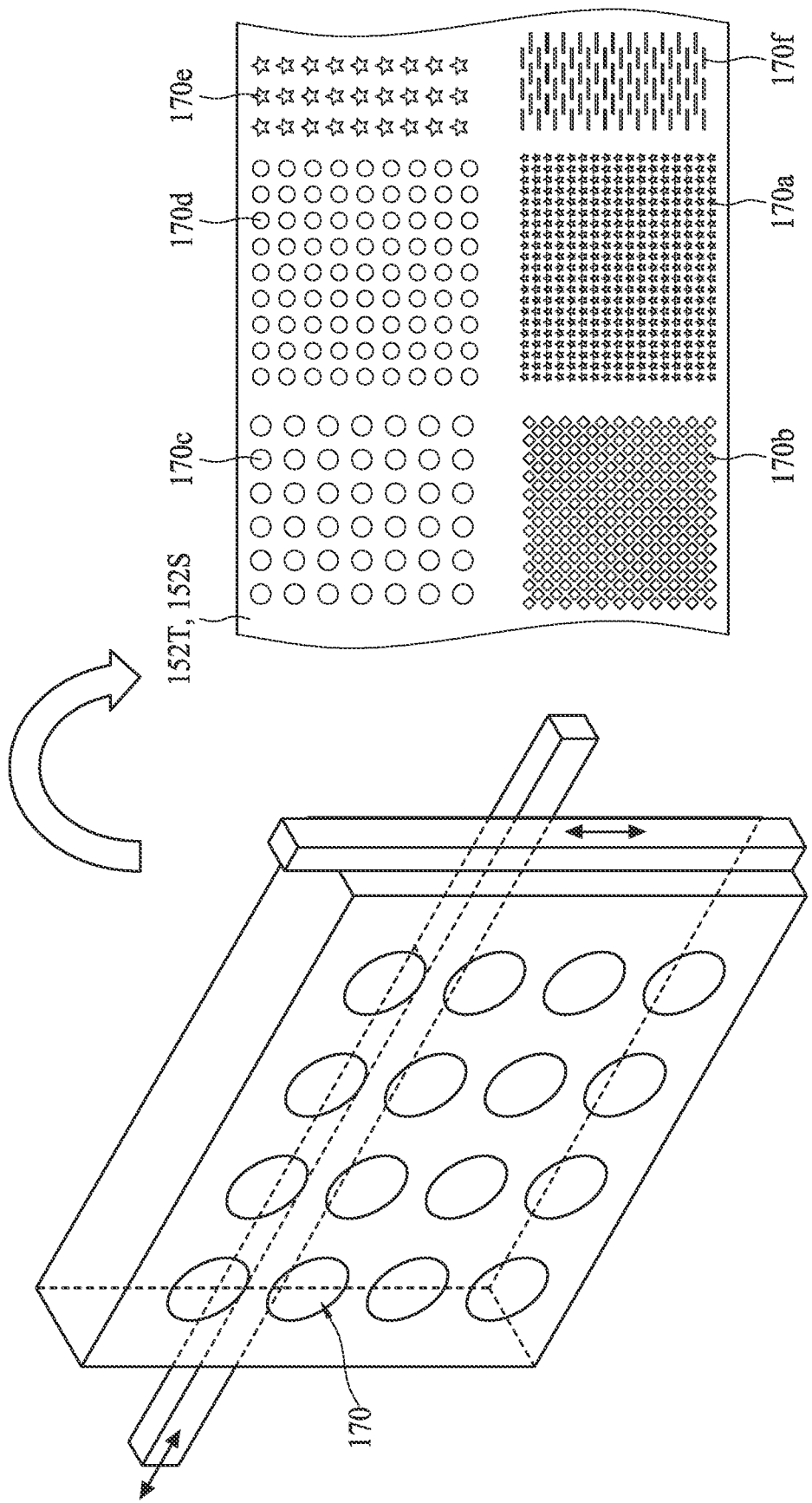
FIG. 4A is a schematic drawing of a portion of an automatic cleaning unit according to aspects of the present disclosure in one or more embodiments.

Referring to FIG. 4A, in some embodiments, the top cleaning part 152T and the pair of side cleaning parts 152S can include a plurality of holes 170. In some embodiments, the plurality of holes 170 are arranged in an array, but the disclosure is not limited thereto. In some embodiments, the plurality of holes 170 have a diameter equal to or greater than 2 mm, but the disclosure is not limited thereto. In some embodiments, the diameter of the plurality of holes 170 is between approximately 2 mm and approximately 10 mm, but the disclosure is not limited thereto. In some embodiments, a hole density of the plurality of holes 170 is greater than 1 hole per cm$^2$, but the disclosure is not limited thereto. If the hole density of the plurality of holes 170 is less than 1 hole per cm$^2$, the suction power may not be sufficient to remove the particles or debris. As shown in FIG. 4A, in some embodiments, the top cleaning part 152T and the pair of side cleaning parts 152S can include holes of different diameters and/or different shapes. In some embodiments, the top cleaning part 152T and the pair of side cleaning parts 152S can include holes 170a having a rectangular shape, holes 170b having a rectangular shape and that are larger than the holes 170a, holes 170c having a circular shape, holes 170d having a circular shape and that are smaller than the holes 170c, holes 170e having a star shape, or holes 170f of a slot type. It should be understood that combinations of the holes 170a to 170f can be selectively arranged to form different patterns depending on different cleaning requirements. For example, in some embodiments, the holes directly facing the wheels of the wheeled trolley 142 can have a smaller diameter, such that at a particular level of vacuum force, greater suction force is obtained through the smaller holes. In some embodiments, the hole diameter of the holes directly facing the wheels of the wheeled trolley 142 may be smaller, or the hole density of the holes directly facing the wheels of the wheeled trolley 142 may be greater, such that the suction power of a portion of the cleaning parts 152T and 152S directly facing the wheels of the wheeled trolley 142 is 1.3 times the suction power of a portion of the cleaning parts 152T and 152S not directly facing the wheels of the wheeled trolley 142. In other embodiments, for example but not limited thereto, the holes 170 are arranged to form a pattern including different hole densities, and the hole density of a portion of the pattern directly facing the wheels of the wheeled trolley 142 is greater than others, and thus greater suction pressure is provided in that portion.

Figure 4B:
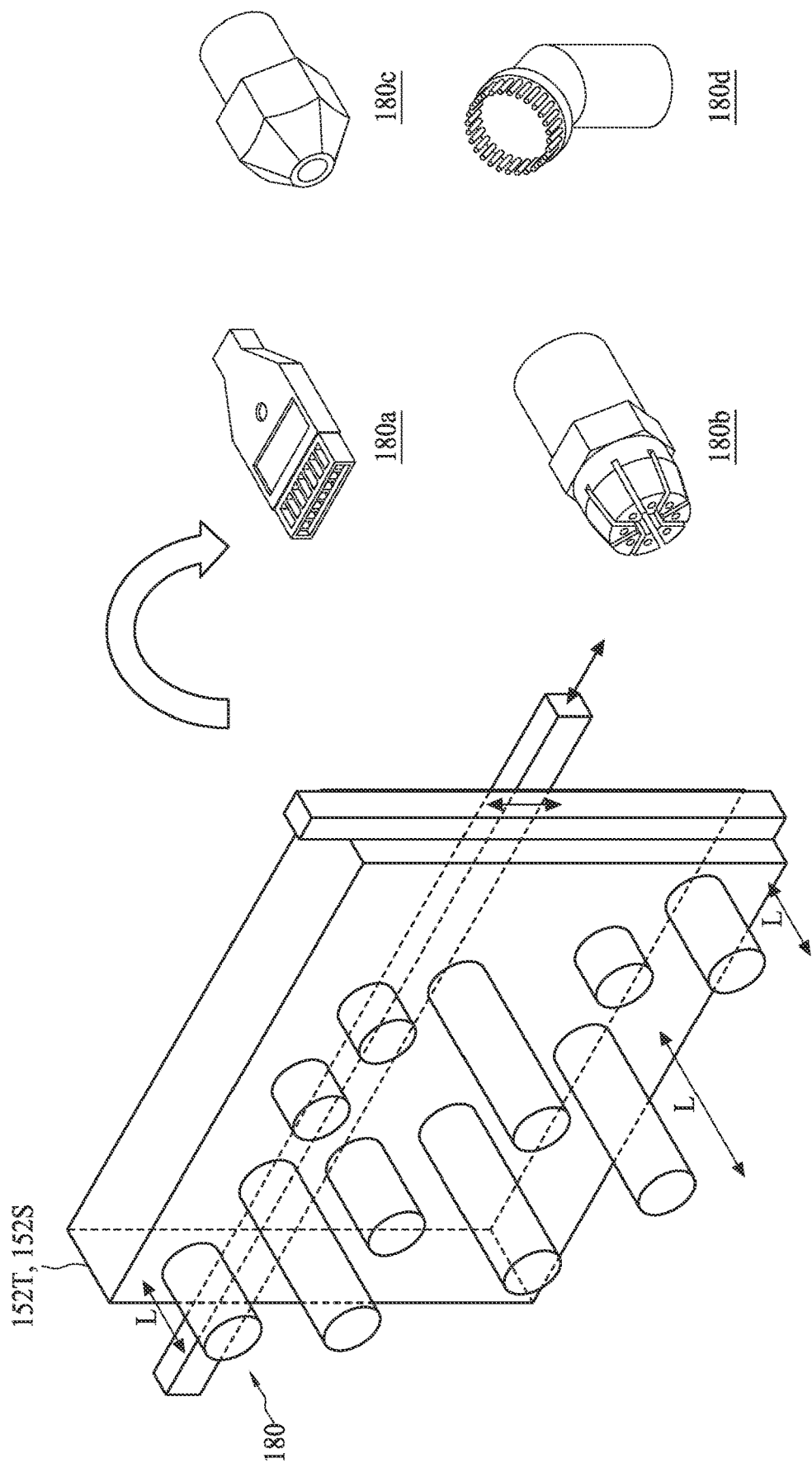
FIG. 4B is a schematic drawing of a portion of an automatic cleaning unit according to aspects of the present disclosure in one or more embodiments.

Referring to FIG. 4B, the top cleaning part 152T and the pair of side cleaning parts 152S can include a plurality of nozzles 180. In some embodiments, a density of the plurality of nozzles 180 can be greater than 1 nozzle per 25 cm$^2$. If the density of the plurality of nozzles 180 is less than 1 nozzle per 25 cm$^2$, the suction power may not be sufficient to remove the particles or debris. In some embodiments, the nozzles can be arranged in an array, but the disclosure is not limited thereto. In some embodiments, the nozzles 180 can have different types. For example, a flat-type nozzle 180a, an 8-hole nozzle 180b, a 1-hole nozzle 180c and/or a nozzle with brush 180d can be used, but the disclosure is not limited thereto. In some embodiments, a density of the nozzles 180 In some embodiments, a length L of the nozzles 180 is between approximately 5 cm and approximately 30 cm, but the disclosure is not limited thereto. In some embodiments, the nozzles 180 can includes different lengths L, and it should be understood that the lengths L of the nozzles 180 depend on different cleaning requirements. For example, in some embodiments, the nozzles 180 directly facing the wheels of the wheeled trolley 142 can have greater length L, such that those nozzles are nearer to the wheels and greater suction force can be provided.

Figure 5:
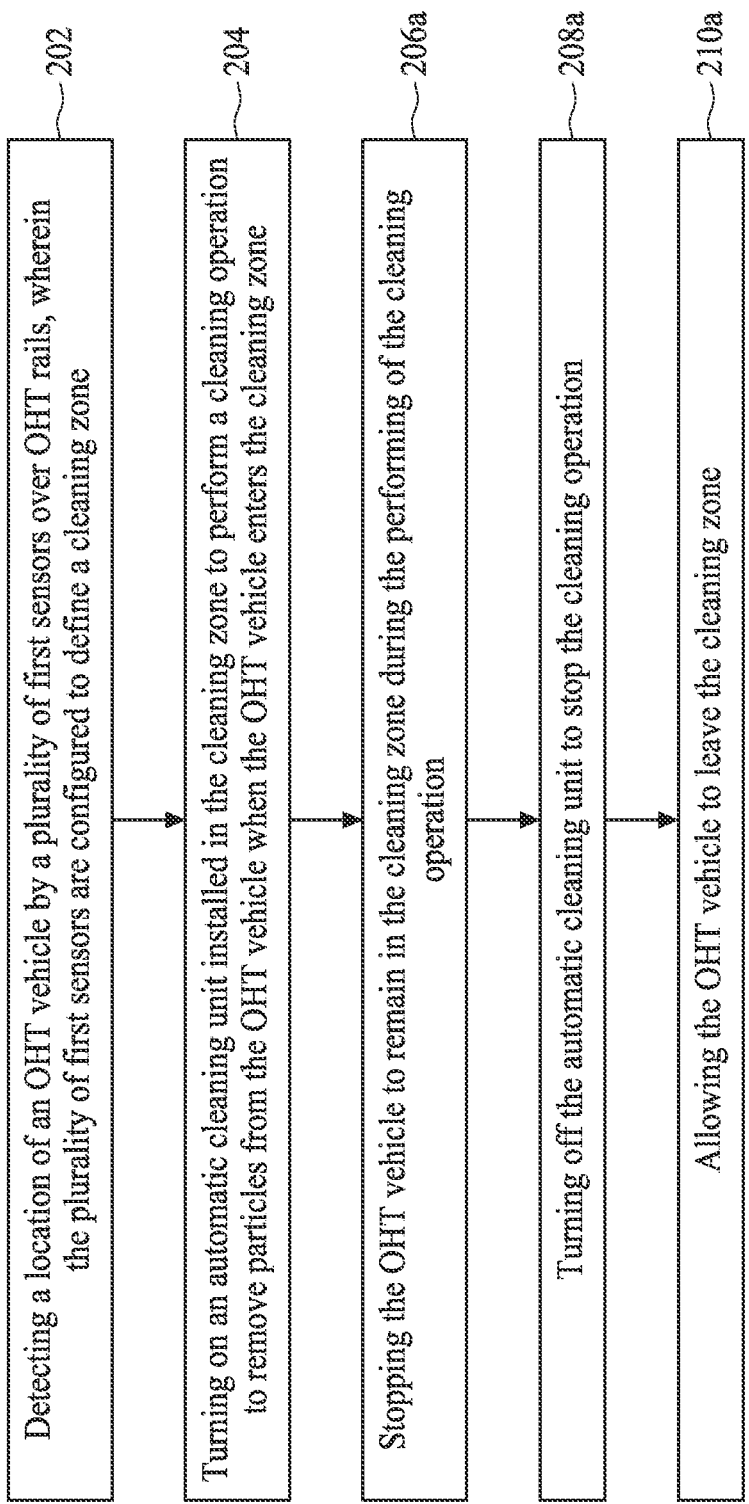
FIG. 5 is a flowchart representing a method for cleaning an OHT vehicle according to aspects of the present disclosure.

FIG. 5 is a flowchart of a method 20 for cleaning an OHT vehicle. The method 20 includes an operation 202, detecting a location of an OHT vehicle by a plurality of first sensors over OHT rails. In some embodiments, the first sensors are configured to define a cleaning zone. The method 20 further includes an operation 204, turning on an automatic cleaning unit installed in the cleaning zone to perform a cleaning operation to remove particles from the OHT vehicle when the OHT vehicle enters the cleaning zone. The method 20 further includes an operation 206a, stopping the OHT vehicle to remain in the cleaning zone during the performing of the cleaning operation. The method 20 further includes an operation 208a, turning off the automatic cleaning unit to stop the cleaning operation. The method 20 further includes an operation 210a, allowing the OHT vehicle to leave the cleaning zone. The method 20 will be further described according to one or more embodiments.

Figure 6:
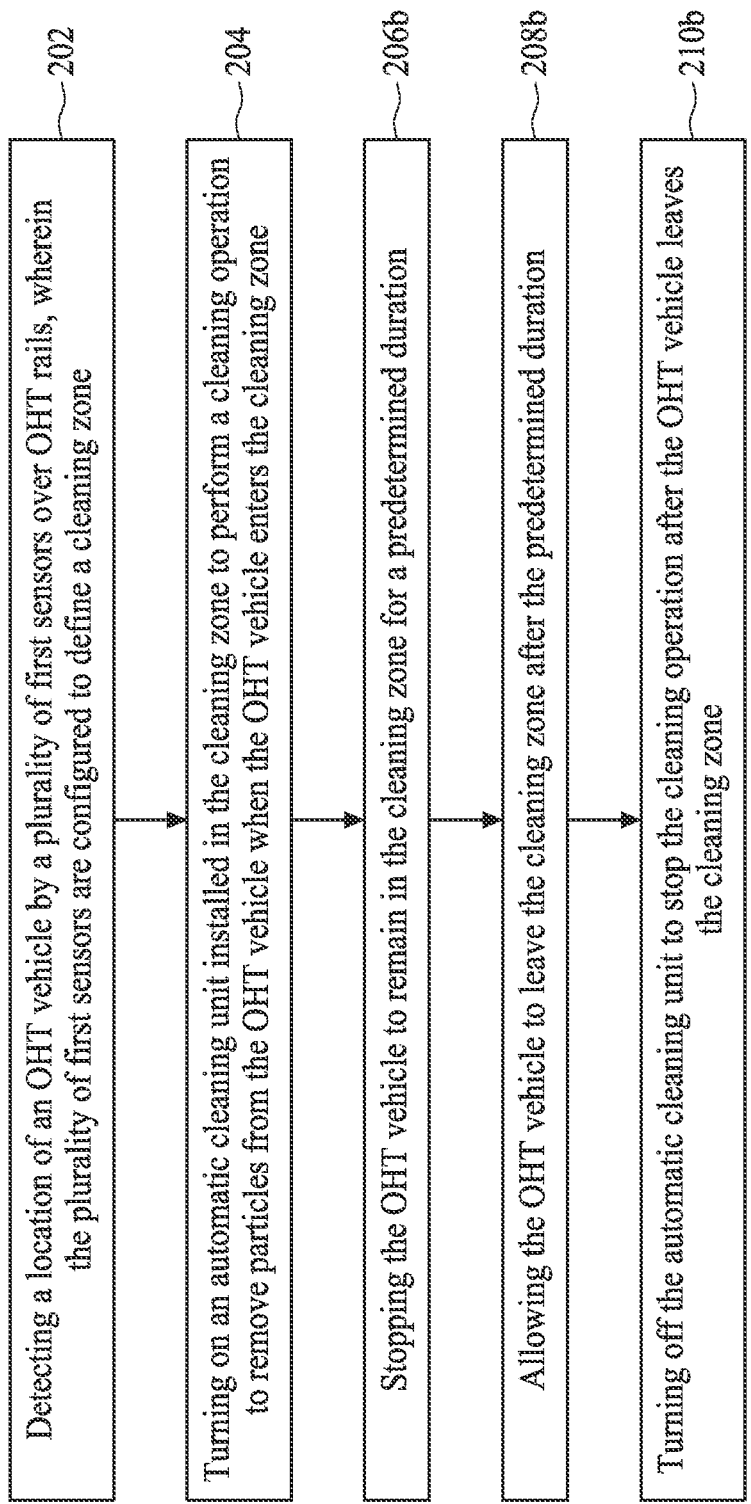
FIG. 6 is a flowchart representing a method for cleaning an OHT vehicle according to aspects of the present disclosure.

FIG. 6 is a flowchart of a method 22 for cleaning an OHT vehicle. The method 22 includes an operation 202, detecting a location of an OHT vehicle by a plurality of first sensors over OHT rails. In some embodiments, the first sensors are configured to define a cleaning zone. The method 22 further includes an operation 204, turning on an automatic cleaning unit installed in the cleaning zone to perform a cleaning operation to remove particles from the OHT vehicle when the OHT vehicle enters the cleaning zone. The method 22 further includes an operation 206b, stopping the OHT vehicle to remain in the cleaning zone for a predetermined duration. The method 22 further includes an operation 208b, allowing the OHT vehicle to leave the cleaning zone after the predetermined duration. The method 22 further includes an operation 210b, turning off the automatic cleaning unit to stop the cleaning operation after the OHT vehicle leaves the cleaning zone. The method 22 will be further described according to one or more embodiments.

Referring to FIGS. 1 to 3 again, as mentioned above, the OHT vehicles 140 are operable to transport the wafer carrier through the system 100 along the OHT rails 110. It is found that OHT vehicles 140 have a tendency to generate particles or debris due to friction between wheels/rollers and the OHT rails 110. To avoid such particles from falling down and contaminating the tools, those particles must be removed, and the method 20 or 22 is performed.

In some embodiments, the first sensors 154a of each automatic cleaning unit 150 detect a location of the OHT vehicle 140 according to operation 202 of the method 20. In some embodiments, when the first sensors 154a detect one of the OHT vehicles 140 enters the cleaning zone 106, signals are sent to the controller 160. In other words, when the first sensors 154a detect the OHT vehicle 140 approaching the automatic cleaning unit 150, signals are sent to the controller 160. The controller 160 instructs to turn on the automatic cleaning unit 150 according to operation 204 of the method 20. Accordingly, the vacuum generator 158 is turned on by the controller 160 and a cleaning operation is performed to remove the particles from the OHT vehicle 140 in the cleaning zone 106. In some embodiments, vacuum suction is generated to suck out the particles from the wheeled trolley 142 through the top cleaning part 152T, as shown in FIG. 2. In other embodiments, vacuum suction is generated to suck out the particles from the wheeled trolley 142 through the top cleaning part 152T and the pair of side cleaning parts, as shown in FIG. 3.

Further, the controller 160 instructs the OHT vehicle 140 entering the cleaning zone 106 to stop. The OHT vehicle 140 therefore remains in the cleaning zone 106 during conducting of the cleaning operation according to operation 206a of the method 20. In some embodiments, the OHT vehicle 140 is stopped directly under the top cleaning part 152T, as shown in FIG. 2. In some embodiments, the OHT vehicle 140 is stopped between the top cleaning part 152T and the pair of side cleaning parts 152S, as shown in FIG. 3. It should be noted that a duration for performing the cleaning operation can be adjusted depending on different conditions. In some embodiments, the automatic cleaning unit 150, i.e., the vacuum generator 158 of the automatic cleaning unit 150, is turned off to stop the cleaning operation according to operation 208a of the method 20, and the OHT vehicle 140 is allowed to leave the cleaning zone 106 according to operation 210a of the method 20. In addition, the automatic cleaning unit 150, i.e. the vacuum generator 158, will be turned on the next time that the first sensors 154a detect another OHT vehicle 140 entering the cleaning zone 106. According to the method 20, the OHT vehicle 140 leaves the cleaning zone 106 after stopping the cleaning operation.

In some embodiments, the second sensors 156a and 156b can be used to perform an OHT vehicle cleaning check. In some embodiments, a first image is captured when the OHT vehicle 140 enters the cleaning zone 106 by the second sensor 156a at the entry of the cleaning zone 106, and a second image is captured when the vehicle 140 leaves the cleaning zone 106 by another second sensor 156b at the exit of the cleaning zone 106. The first image and the second image are then compared to check the cleaning efficacy. According to the cleaning efficacy obtained by performing the cleaning check, parameters of the cleaning operation of the automatic cleaning unit 150, such as the duration for performing the cleaning operation, the vacuum force, the pattern formed by the arrangement of holes 170 of different shapes and sizes and the distance between the nozzles 180 and the OHT vehicle 140, can be adjusted to improve the cleaning efficacy.

In some embodiments, the first sensors 154a of each automatic cleaning unit 150 detect a location of the OHT vehicle 140 according to operation 202 of the method 22. In some embodiments, when the first sensors 154a detect one of the OHT vehicles 140 entering the cleaning zone 106, signals are sent to the controller 160. In other words, when the first sensors 154a detect the OHT vehicle 140 approaching the automatic cleaning unit 150, signals are sent to the controller 160. The controller 160 instructs to turn on the automatic cleaning unit 150 according to operation 204 of the method 22. Accordingly, the vacuum generator 158 is turned on by the controller 160 and a cleaning operation is performed to remove the particles from the OHT vehicle 140 in the cleaning zone 106. In some embodiments, vacuum suction is generated to suck out the particles from the wheeled trolley 142 through the top cleaning part 152T, as shown in FIG. 2. In other embodiments, vacuum suction is generated to suck out the particles from the wheeled trolley 142 through the top cleaning part 152T and the pair of side cleaning parts, as shown in FIG. 3.

Further, the controller 160 instructs the OHT vehicle 140 entering the cleaning zone 106 to stop. The OHT vehicle 140 remains in the cleaning zone 106 for a predetermined duration according to operation 206b of the method 22. In some embodiments, the predetermined duration can be, for example but not limited thereto, 20 minutes. In some embodiments, the OHT vehicle 140 is stopped directly under the top cleaning part 152T, as shown in FIG. 2. In some embodiments, the OHT vehicle 140 is stopped between the top cleaning part 152T and the pair of side cleaning parts 152S, as shown in FIG. 3. In some embodiments, the OHT vehicle 140 is allowed to leave the cleaning zone 106 according to operation 208b of the method 22. Further, when the first sensors 154b detect the OHT vehicle 140 leaving the cleaning zone 106, a signal is sent to the controller 160, and the automatic cleaning unit 150, i.e., the vacuum generator 158 of the automatic cleaning unit 150, is turned off by the controller 160 to stop the cleaning operation according to operation 210b of the method 22. In addition, the automatic cleaning unit 150, i.e. the vacuum generator 158, will be turned on the next time that the first sensors 154a detect another OHT vehicle 140 entering the cleaning zone 106. According to the method 22, the cleaning operation is stopped after the OHT vehicle 140 leaves the cleaning zone 106. In some embodiments, it can be assured that particles will not fall back onto the OHT vehicle 140.

In some embodiments, the second sensors 156a and 156b can be used to perform an OHT vehicle cleaning check. In some embodiments, a first image is captured when the OHT vehicle 140 enters the cleaning zone 106 by the second sensor 156a at the entry of the cleaning zone 106, and a second image is captured when the vehicle 140 leaves the cleaning zone 106 by another second sensor 156b at the exit of the cleaning zone 106. The first image and the second image are then compared to check the cleaning efficacy. According to the cleaning efficacy obtained by performing the cleaning check, the predetermined duration or parameters of the cleaning operation of the automatic cleaning unit 150, such as the vacuum force, the holes 170 of different shapes and sizes and the distance between the nozzles 180 and the OHT vehicle 140, can be adjusted to improve the cleaning efficacy.

In some embodiments, every time the OHT vehicles 140 enter one of the automatic cleaning units 150, the OHT vehicles 140 are cleaned. Since a plurality of automatic cleaning units 150 are used in the system 100, the OHT vehicles 140 can be cleaned many times and thus the duration of time required for performing the cleaning operation in the method 20 or the predetermined duration in the method 22 can be further reduced while the cleaning efficacy is still improved due to the plurality of automatic cleaning units 150.

In some embodiments, the controller 160 can select some of the automatic cleaning units 150 to perform the cleaning operation. Therefore, the OHT vehicles 140 will be cleaned only when entering the selected automatic cleaning units 150. Accordingly, downtime can be further reduced.

In some embodiments, the controller can select some of the OHT vehicles 140 to enter the automatic cleaning units 150 when the cleaning check reveals that particles still remain on those OHT vehicles 140. Those OHT vehicles 140 are therefore recognized as non-clean, and assigned to enter the automatic cleaning units 150 again.

The present disclosure provides an automatic cleaning unit, a system including the automatic cleaning units, and a method for cleaning the OHT vehicles. The automatic cleaning units can be to function on the OHT rails. The automatic cleaning unit includes sensors to detect the OHT vehicles and thus can be automatically turned on by the controller when the OHT vehicles approach the cleaning unit and a cleaning operation is performed. The automatic cleaning unit can also be automatically turned off by the controller when the cleaning operation is stopped or after the OHT vehicles leave the automatic cleaning zone. Further, the automatic cleaning unit includes vacuum cleaning parts for removing particles from the top and sides of the wheeled trolley of the OHT vehicles.

According to the automatic cleaning units and the system including the automatic cleaning units, the cleaning operation is performed automatically without manual involvement. In some embodiments, manual cleaning requires more than one hour. In some embodiments, since the automatic cleaning units are installed along the OHT rails, and the OHT vehicles can be cleaned many times along the OHT rails, a duration for performing the automatic cleaning operation can be reduced to less than 20 minutes while the cleaning efficacy is still improved. Further, the cleaning efficacy can be improved by adjusting the duration for performing the cleaning operation, and the parameters of each automatic cleaning unit. In some embodiments, the quantity of the automatic cleaning units can be adjusted depending on the cleaning requirements of FAB or a length of the intra-bay loop and the inter-bay loop. In some embodiments, in a system having more than 8,000 OHT vehicles, a cycle time for cleaning all of the OHT vehicles can be reduced from 3 months to one week. It is found that since the frequency for cleaning the OHT vehicles is increased, fewer particles may be generated and disposed over the wheeled trolley, and thus the duration for performing the cleaning operation can be further reduced. Additionally, by turning on the vacuum generator only when the OHT vehicle is in the cleaning zone, power consumption is reduced.

In some embodiments, a system for a semiconductor fabrication facility is provided. The system includes a network of OHT rails, a plurality of first sensors disposed on the network of OHT rails, and a plurality of automatic cleaning units. The plurality of first sensors are configured to define a plurality of cleaning zones, and to detect locations of a plurality of OHT vehicles movably mounted on the network of OHT rails. The automatic cleaning units are installed in the cleaning zones. The automatic cleaning units are separated from each other by a distance. In some embodiments, each of the plurality of automatic cleaning units is installed over the network of OHT rails and separated from the network of OHT rails to allow the plurality of OHT vehicles to pass through along a moving direction.

In some embodiments, a method for cleaning an OHT vehicle is provided. The method includes the following operations. A location of an OHT vehicle is detected by a plurality of first sensors over OHT rails. The first sensors are configured to define a cleaning zone. An automatic cleaning unit installed in the cleaning zone is turned on to perform a cleaning operation to remove particles from the OHT vehicle when the OHT vehicle enters the cleaning zone. The automatic cleaning unit is turned off to stop the cleaning operation.

In some embodiments, a system for a semiconductor fabrication facility is provided. The system includes a network of OHT rails, a plurality of first sensors on the network of OHT rails, and a plurality of automatic cleaning units. The plurality of first sensors are configured to define a plurality of cleaning zones, and to detect locations of a plurality of OHT vehicles movably mounted on the network of OHT rails. The automatic cleaning units are installed in the cleaning zones. Each of the plurality of automatic cleaning units includes a vacuum generator, a controller, and a top cleaning part. The controller is in communication with the plurality of first sensors and the vacuum generator. The top cleaning part is installed on the OHT rails in the cleaning zone and coupled to the vacuum generator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for a semiconductor fabrication facility, comprising:
    a network of OHT rails;
    a plurality of first sensors on the network of OHT rails, wherein the plurality of first sensors are configured to define a plurality of cleaning zones and to detect locations of a plurality of OHT vehicles movably mounted on the network of OHT rails; and
    a plurality of automatic cleaning units installed in the cleaning zones, wherein the plurality of automatic cleaning units are separated from each other by a distance, and each of the plurality automatic cleaning units is installed over the network of OHT rails and spaced apart from the network of OHT rails to allow the plurality of OHT vehicles to pass through along a moving direction,
    wherein each of the plurality of automatic cleaning units comprises a top cleaning part disposed over the network of OHT rails in the cleaning zone, and the each of the plurality of automatic cleaning units comprises a pair of side cleaning parts disposed at two sides of the network of OHT rails in one of the plurality of cleaning zones and coupled to the top cleaning part.

2. The system of claim 1, wherein the distance between two of the plurality of automatic cleaning units is between approximately 500 m and approximately 3000 m.

3. The system of claim 1, wherein the top cleaning part and the pair of side cleaning parts respectively comprise a plurality of holes or a plurality of nozzles.

4. The system of claim 1, further comprising at least a second sensor disposed over the network of OHT rails, wherein the second sensor is configured to perform an OHT vehicle cleaning check.

5. A system for a semiconductor fabrication facility, comprising:
    a network of OHT rails;
    a plurality of first sensors on the network of OHT rails, wherein the plurality of first sensors are configured to define a plurality of cleaning zones and to detect locations of a plurality of OHT vehicles movably mounted on the network of OHT rails; and
    a plurality of automatic cleaning units installed in the cleaning zones, wherein each of the plurality of automatic cleaning units comprises:
        a vacuum generator;
        a controller in communication with the plurality of first sensors and the vacuum generator; and
        a top cleaning part installed over the OHT rails in the cleaning zone and coupled to the vacuum generator.

6. The system of claim 5, wherein each of the plurality of automatic cleaning units is installed over the network of OHT rails and spaced apart from the network of OHT rails to allow the plurality of OHT vehicles to pass through along a moving direction.

7. The system of claim 5, wherein the plurality of automatic cleaning units are separated from each other by a distance.

8. The system of claim 7, wherein the distance between two of the plurality of automatic cleaning units is between approximately 500 m and approximately 3000 m.

9. The system of claim 5, wherein the controller turns on the vacuum generator to perform a vacuum cleaning operation through the top cleaning part when the plurality of first sensors detect the OHT vehicle entering the cleaning zone.

10. The system of claim 5, wherein the each of the plurality of automatic cleaning units comprises a pair of side cleaning parts disposed at two sides of the network of OHT rails in one of the plurality of cleaning zones and coupled to the top cleaning part.

11. The system of claim 10, wherein the top cleaning part and the pair of side cleaning parts respectively comprise a plurality of holes.

12. The system of claim 10, wherein the top cleaning part and the pair of side cleaning parts respectively comprise a plurality of nozzles.

13. The system of claim 5, further comprising at least a second sensor disposed over the network of OHT rails, wherein the second sensor is configured to perform an OHT vehicle cleaning check.

14. A system for a semiconductor fabrication facility, comprising:
- a network of OHT rails;
- a plurality of first sensors on the network of OHT rails, wherein the plurality of first sensors are configured to detect locations of a plurality of OHT vehicles movably mounted on the network of OHT rails;
- at least one automatic cleaning unit installed over the network of OHT rails;
- a controller in communication with the plurality of first sensors; and
- at least a second sensor disposed over the network of OHT rails, wherein the second sensor is configured to perform an OHT vehicle cleaning check.

15. The system of claim 14, wherein the at least one automatic cleaning unit comprises:
- a vacuum generator; and
- a top cleaning part installed over the OHT rails and coupled to the vacuum generator,
- wherein the controller turns on the vacuum generator to perform a vacuum cleaning operation through the top cleaning part when the plurality of first sensors detect the OHT vehicles entering the at least one automatic cleaning unit.

16. The system of claim 15, wherein the at least one automatic cleaning unit comprises a pair of side cleaning parts disposed at two sides of the network of OHT rails and coupled to the top cleaning part.

17. The system of claim 16, wherein the top cleaning part and the pair of side cleaning parts respectively comprise a plurality of holes.

18. The system of claim 16, wherein the pair of side cleaning parts are aligned with a wheeled trolley of the OHT vehicles in a horizontal direction.

19. The system of claim 16, wherein the pair of side cleaning parts are movable by a linear motion guide, an X-Y table or ball screws.

20. The system of claim 16, wherein the top cleaning part and the pair of side cleaning parts respectively comprise a plurality of nozzles.

\* \* \* \* \*